(12) United States Patent
Lee

(10) Patent No.: US 9,599,516 B2
(45) Date of Patent: Mar. 21, 2017

(54) SEMICONDUCTOR PACKAGES AND DATA STORAGE DEVICES INCLUDING THE SAME

(71) Applicant: Samsung Electronics Co., Ltd., Suwon-si, Gyeonggi-do (KR)

(72) Inventor: EungChang Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 64 days.

(21) Appl. No.: 14/499,629

(22) Filed: Sep. 29, 2014

(65) Prior Publication Data

US 2015/0262708 A1  Sep. 17, 2015

(30) Foreign Application Priority Data

Mar. 11, 2014 (KR) .................. 10-2014-0028456

(51) Int. Cl.
*H01L 23/48* (2006.01)
*G01K 7/16* (2006.01)
(Continued)

(52) U.S. Cl.
CPC .............. *G01K 7/16* (2013.01); *G01K 7/02* (2013.01); *G01L 1/2293* (2013.01); *G11C 7/04* (2013.01); *H01L 25/105* (2013.01); *H01L 25/18* (2013.01); *G01B 7/20* (2013.01); *G11C 5/04* (2013.01); *H01L 22/32* (2013.01); *H01L 23/3128* (2013.01); *H01L 23/481* (2013.01); *H01L 23/585* (2013.01); *H01L 24/05* (2013.01); *H01L 24/06* (2013.01); *H01L 24/13* (2013.01); *H01L 24/16* (2013.01); *H01L 24/17* (2013.01); *H01L 24/32* (2013.01); *H01L 24/45* (2013.01); *H01L 24/48* (2013.01); *H01L 24/73* (2013.01); *H01L 25/0652* (2013.01); *H01L 25/0655* (2013.01); *H01L 25/0657* (2013.01); *H01L 2224/0401* (2013.01); *H01L 2224/04042* (2013.01); *H01L 2224/0557* (2013.01);
(Continued)

(58) Field of Classification Search
CPC ............................. H01L 23/481; H01L 22/32
See application file for complete search history.

(56) References Cited

U.S. PATENT DOCUMENTS 3,462,317 A * 8/1969 Jimenez .................. G01K 7/02
  136/230
4,651,275 A * 3/1987 McDonough ......... G06F 9/3802
  712/208

(Continued)

FOREIGN PATENT DOCUMENTS

JP   2010-071817    4/2010
KR   10-2001-0038316 A   5/2001
KR   10-2008-0091941 A   10/2008

*Primary Examiner* — Evan Pert
(74) *Attorney, Agent, or Firm* — Ward and Smith, P.A.

(57) ABSTRACT

A semiconductor package includes a package substrate having first connecting pads and second connecting pads, and a semiconductor chip mounted on the package substrate. The semiconductor chip includes a semiconductor device comprising a semiconductor substrate and electrically connected to input/output (I/O) pads, and a measuring device formed on the semiconductor device and electrically connected to measuring pads. The I/O pads are electrically connected to the first connecting pads, and the measuring pads are electrically connected to the second connecting pads.

19 Claims, 17 Drawing Sheets

(51) Int. Cl.
  *H01L 25/18* (2006.01)
  *G11C 7/04* (2006.01)
  *G01K 7/02* (2006.01)
  *G01L 1/22* (2006.01)
  *H01L 25/10* (2006.01)
  *H01L 21/66* (2006.01)
  *G11C 5/04* (2006.01)
  *G01B 7/16* (2006.01)
  *H01L 23/31* (2006.01)
  *H01L 23/58* (2006.01)
  *H01L 23/00* (2006.01)
  *H01L 25/065* (2006.01)

(52) U.S. Cl.
  CPC ........ *H01L 2224/05554* (2013.01); *H01L 2224/05567* (2013.01); *H01L 2224/05568* (2013.01); *H01L 2224/06135* (2013.01); *H01L 2224/06181* (2013.01); *H01L 2224/131* (2013.01); *H01L 2224/16145* (2013.01); *H01L 2224/16146* (2013.01); *H01L 2224/16225* (2013.01); *H01L 2224/16227* (2013.01); *H01L 2224/17181* (2013.01); *H01L 2224/32145* (2013.01); *H01L 2224/32225* (2013.01); *H01L 2224/451* (2013.01); *H01L 2224/48091* (2013.01); *H01L 2224/48145* (2013.01); *H01L 2224/48227* (2013.01); *H01L 2224/48465* (2013.01); *H01L 2224/73257* (2013.01); *H01L 2224/73265* (2013.01); *H01L 2225/0651* (2013.01); *H01L 2225/06506* (2013.01); *H01L 2225/06513* (2013.01); *H01L 2225/06517* (2013.01); *H01L 2225/06541* (2013.01); *H01L 2225/06562* (2013.01); *H01L 2225/06565* (2013.01); *H01L 2225/06596* (2013.01); *H01L 2225/1023* (2013.01); *H01L 2225/1058* (2013.01); *H01L 2924/00014* (2013.01); *H01L 2924/1431* (2013.01); *H01L 2924/1434* (2013.01); *H01L 2924/1436* (2013.01); *H01L 2924/1437* (2013.01); *H01L 2924/1438* (2013.01); *H01L 2924/1441* (2013.01); *H01L 2924/1443* (2013.01); *H01L 2924/15184* (2013.01); *H01L 2924/15192* (2013.01); *H01L 2924/15311* (2013.01); *H01L 2924/15331* (2013.01); *H01L 2924/181* (2013.01)

(56) References Cited

U.S. PATENT DOCUMENTS

| | | | | |
|---|---|---|---|---|
| 5,287,081 A | * | 2/1994 | Kinard | H01L 35/08 338/24 |
| 5,982,189 A | * | 11/1999 | Motika | G01R 31/30 324/750.03 |
| 6,172,611 B1 | * | 1/2001 | Hussain | G06F 1/206 340/584 |
| 6,711,904 B1 | * | 3/2004 | Law | F25B 21/02 257/E23.08 |
| 6,972,489 B2 | * | 12/2005 | Wu | H01L 21/563 257/734 |
| 7,988,354 B2 | * | 8/2011 | Jansen | G01K 1/14 257/470 |
| 8,013,431 B2 | | 9/2011 | Lee | |
| 8,294,247 B2 | * | 10/2012 | Kwak | H01L 23/34 257/467 |
| 2001/0054904 A1 | * | 12/2001 | Inoue | G01R 31/2884 324/719 |
| 2006/0027259 A1 | * | 2/2006 | Watanabe | G01J 5/12 136/224 |
| 2008/0169860 A1 | | 7/2008 | Song | |
| 2009/0030559 A1 | * | 1/2009 | Sharma | G05D 23/2225 700/300 |
| 2011/0075387 A1 | | 3/2011 | Homer et al. | |
| 2012/0133427 A1 | | 5/2012 | Kim et al. | |
| 2012/0163413 A1 | | 6/2012 | Kim et al. | |
| 2012/0201008 A1 | * | 8/2012 | Hershberger | H05K 1/0203 361/720 |

\* cited by examiner

SEMICONDUCTOR PACKAGES AND DATA STORAGE DEVICES INCLUDING THE SAME

CROSS-REFERENCE TO RELATED APPLICATION

This U.S. non-provisional patent application claims priority under 35 U.S.C. §119 to Korean Patent Application No. 10-2014-0028456, filed Mar. 11, 2014, in the Korean Intellectual Property Office, the disclosure of which is hereby incorporated by reference in its entirety.

FIELD

The inventive concept relates to a semiconductor package and, more particularly, to a semiconductor package including a measuring device capable of physical variation of the semiconductor package and a data storage device including the same.

BACKGROUND

Usage of mobile devices such as smart phones, tablet personal computers, digital cameras, MP3 players, and personal digital assistants (PDAs) has increased markedly. Since various application programs may operate within mobile devices, the mobile devices may include various semiconductor devices such as a working memory (e.g., a dynamic random access memory (DRAM)), a non-volatile memory, and an application processor (AP). To improve performance and reliability of the semiconductor devices, physical variations of the semiconductor devices may be measured to control the semiconductor devices based on the measured data in real time.

SUMMARY

In one aspect, a semiconductor package may include a package substrate having first connecting pads and second connecting pads, and a semiconductor chip mounted on the package substrate. The semiconductor chip may include a semiconductor device, a measuring device, input/output (I/O) pads, and measuring pads. The semiconductor device may include a semiconductor substrate, and be electrically connected to the I/O pads. The measuring device may be on the semiconductor device, and electrically connected to the measuring pads. The I/O pads may be electrically connected to the first connecting pads, and the measuring pads may be electrically connected to the second connecting pads.

In some embodiments, the semiconductor device may further include integrated circuit elements on the semiconductor substrate, and an insulating layer covering the integrated circuit elements. The measuring device may include a redistribution pattern on the insulating layer of the semiconductor device.

In some embodiments, the measuring device may include a thermocouple having metal patterns of metal materials that are different from each other and are on an insulating layer of the semiconductor device.

In some embodiments, the measuring device may include a strain gauge having a metal grid on an insulating layer of the semiconductor device.

In some embodiments, the measuring device may be electrically insulated from the semiconductor device.

In some embodiments, the semiconductor chip may further include through-electrodes penetrating the semiconductor substrate and connected to the measuring pads.

In some embodiments, the semiconductor package may further include bonding wires electrically connecting the measuring pads to the second connecting pads.

In some embodiments, the semiconductor package may further include a controller chip mounted on the package substrate. The controller chip may receive a signal measured from the measuring device of the semiconductor chip to control operation of the semiconductor chip.

In another aspect, a data storage device may include a semiconductor chip comprising a semiconductor device and a measuring device on the semiconductor device, the semiconductor device including a semiconductor substrate, and the measuring device configured to measure physical variation of the semiconductor chip and to output a measured signal based on the physical variation, and a controller receiving the measured signal from the semiconductor chip and controlling operation of the semiconductor chip responsive to the measured signal.

In some embodiments, the semiconductor device may further include integrated circuit elements on the semiconductor substrate, and an insulating layer covering the integrated circuit elements. The measuring device may include a redistribution pattern on the insulating layer of the semiconductor device.

In some embodiments, the measuring device may be electrically insulated from the semiconductor device.

In some embodiments, the measuring device may be configured to measure a temperature of the semiconductor chip to output the measured temperature as the measured signal. In this case, the controller may be configured to compare the measured temperature with a reference temperature. In addition, the controller may be configured to reduce an operating speed of the semiconductor chip when the measured temperature is higher than the reference temperature.

In some embodiments, the measuring device may include a thermocouple having metal patterns of metal materials that are different from each other and are on an insulating layer of the semiconductor device.

In some embodiments, the measuring device may include: a strain gauge having a metal grid on an insulating layer of the semiconductor device.

In another aspect, a semiconductor package may include a memory chip including a semiconductor substrate, integrated circuit elements including data storage elements on the semiconductor substrate, an insulating layer covering the integrated circuit elements, and measuring device on the insulating layer, the measuring device configured to measure physical variation of the memory chip and to output a measured signal based on the physical variation; and a controller receiving the measured signal from the memory to control operation of the memory chip responsive to the measured signal.

In some embodiments, the semiconductor package may further include a first package substrate on which the controller is mounted, and a second package substrate on which the memory chip is mounted. The second package substrate may be stacked on the first package substrate.

In some embodiments, the second package substrate may include first connecting pads and second connecting pads. In this case, the integrated circuit elements may be electrically connected to the first connecting pads and the measuring device are electrically connected to the second connecting pads.

In some embodiments, the measuring device may include a thermocouple having metal patterns of metal materials that are different from each other and are on the insulating layer.

In some embodiments, the measuring device may include a strain gauge having a metal grid on the insulating layer.

In some embodiments, the semiconductor package may further include a package substrate on which the controller and the memory chip are mounted. The controller and the memory chip are spaced apart from each other.

BRIEF DESCRIPTION OF THE DRAWINGS

The inventive concept will become more apparent in view of the attached drawings and accompanying detailed description.

DETAILED DESCRIPTION OF THE EMBODIMENTS

Figure 1:
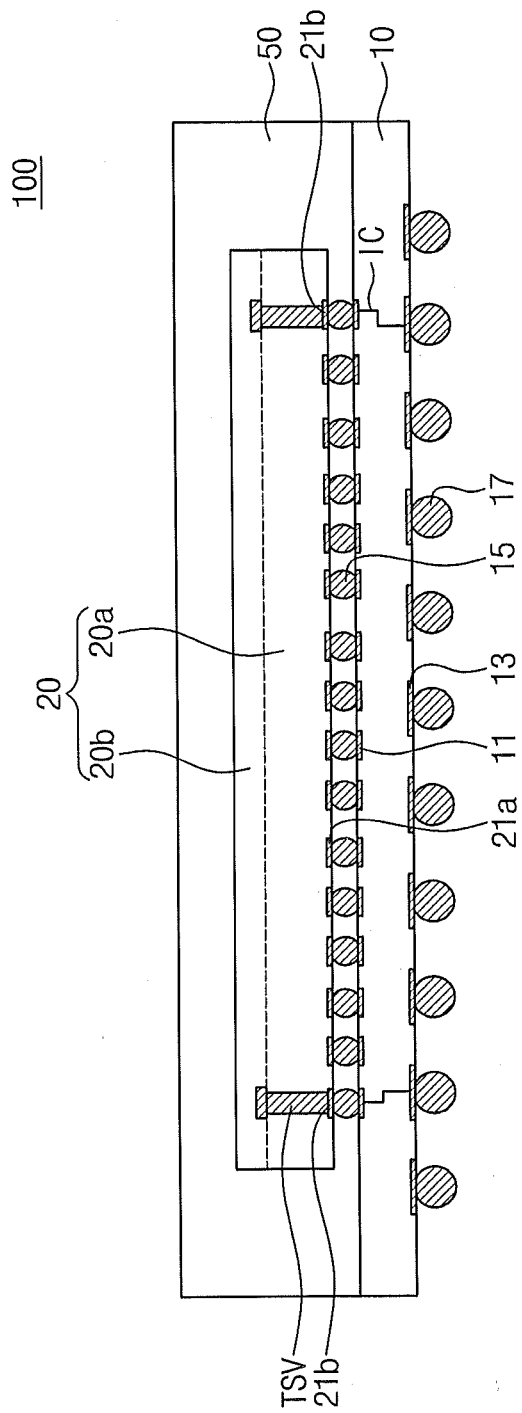
FIG. 1 is a cross-sectional view illustrating a semiconductor package according to some embodiments of the inventive concept.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided here.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is a cross-sectional view illustrating a semiconductor package according to some embodiments of the inventive concepts.

Referring to FIG. 1, a semiconductor package 100 may include a package substrate 10, a memory chip 20 mounted on the package substrate 10, and a molding layer 50 covering the memory chip 20.

The package substrate 10 has a top surface and a bottom surface. And, the package substrate 10 includes bonding pads 11, internal interconnections IC, and external connecting pads 13. The bonding pads 11 may be arranged on the top surface of the package substrate 10, and the external connecting pads 13 may be arranged on the bottom surface of the package substrate 10. The bonding pads 11 may be electrically connected to the external connecting pads 13 through the internal interconnections IC. External connecting terminals 17 (e.g., solder balls or solder bumps) may be bonded to the external connecting pads 13.

The package substrate 10 may be one of various kinds of substrates such as a printed circuit board, a flexible substrate, and a tape substrate. In some embodiments, the package substrate 10 may be formed of a flexible printed circuit board including the internal interconnections IC, a rigid printed circuit board including the internal interconnections IC, or a combination thereof.

In some embodiments, the memory chip 20 may include a memory device 20a and a measuring device 20b formed on the memory device 20a. The measuring device 20b may be electrically insulated from the memory device 20a in the memory chip 20.

The memory chip 20 may include input/output (I/O) pads 21a and measuring pads 21b. Control signals and data signals may be inputted and outputted through the I/O pads 21a. Signals measured from the measuring device 20b may be outputted through the measuring pads 21b. In some embodiments, the I/O pads 21a may be electrically connected to the memory device 20a through interconnections and through-electrodes. The measuring pads 21b may be electrically connected to the measuring device 20b by through-electrodes TSV. The I/O pads 21a and the measuring pads 21b may be arranged on a bottom surface of the memory chip 20 and may be connected to the bonding pads 11 of the package substrate 10 through solder balls or solder bumps 15.

In some embodiments, the memory device 20a may be a non-volatile memory device that retains its data even when its power supply is interrupted. In some embodiments, a NAND-type flash memory device having large capacity and high-speed storage ability may be used as the non-volatile memory device. Alternatively, the memory device 20a may include a phase random access memory (PRAM) device, a magnetic random access memory (MRAM) device, a resistive random access memory (ReRAM) device, a ferroelectric random access memory (FRAM) device, or a NOR flash memory device. In still other embodiments, the memory device 20a may be a volatile memory device such as a dynamic random access memory (DRAM) device or a static random access memory (SRAM) device. The volatile memory device may lose its data when its power supply is interrupted.

In some embodiments, the measuring device 20b may measure physical variation of the memory chip 20 (e.g., a temperature and/or strain of the memory chip 20). The measured signals may be outputted through the measuring pads 21b. The measuring device 20b may include a metal pattern that is formed by using a redistribution process on the memory device 20a. In some embodiments, the measuring device 20b may include a thermocouple having a junction at which two different kinds of metal patterns contact each other. In some embodiments, the measuring device 20b may include a strain gauge capable of measuring the strain on the memory chip 20.

The molding layer 50 may cover the package substrate 10 and the memory chip 20. In some embodiments, the molding layer 50 may become an underfill disposed between the package substrate 10 and the memory chip 20. The molding layer 50 may include an epoxy molding compound.

As described above, the semiconductor package 100 includes the memory chip 20 including the memory device 20a and the measuring device 20b. However, the inventive concept is not limited thereto. In some embodiments, the semiconductor package 100 may include a semiconductor chip including a logic device and the measuring device 20b.

Figure 2A:
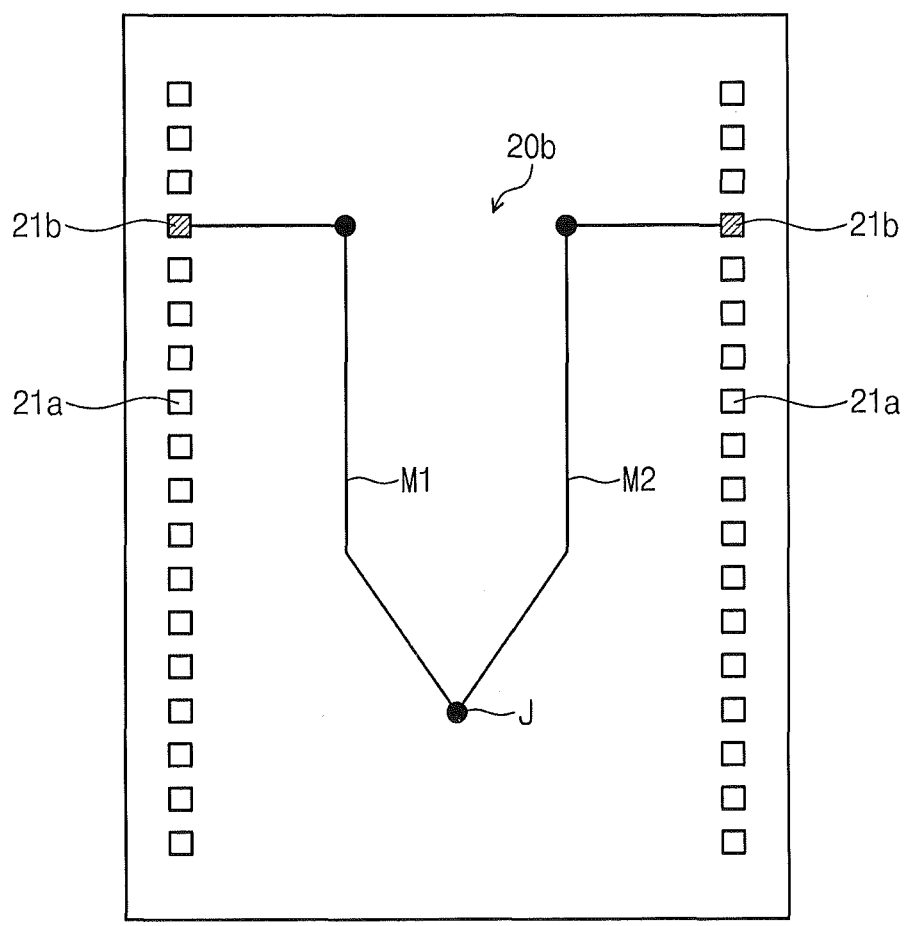
FIGS. 2A and 2B are views illustrating a measuring device of a semiconductor chip according to some embodiments of the inventive concept.
Figure 2B:
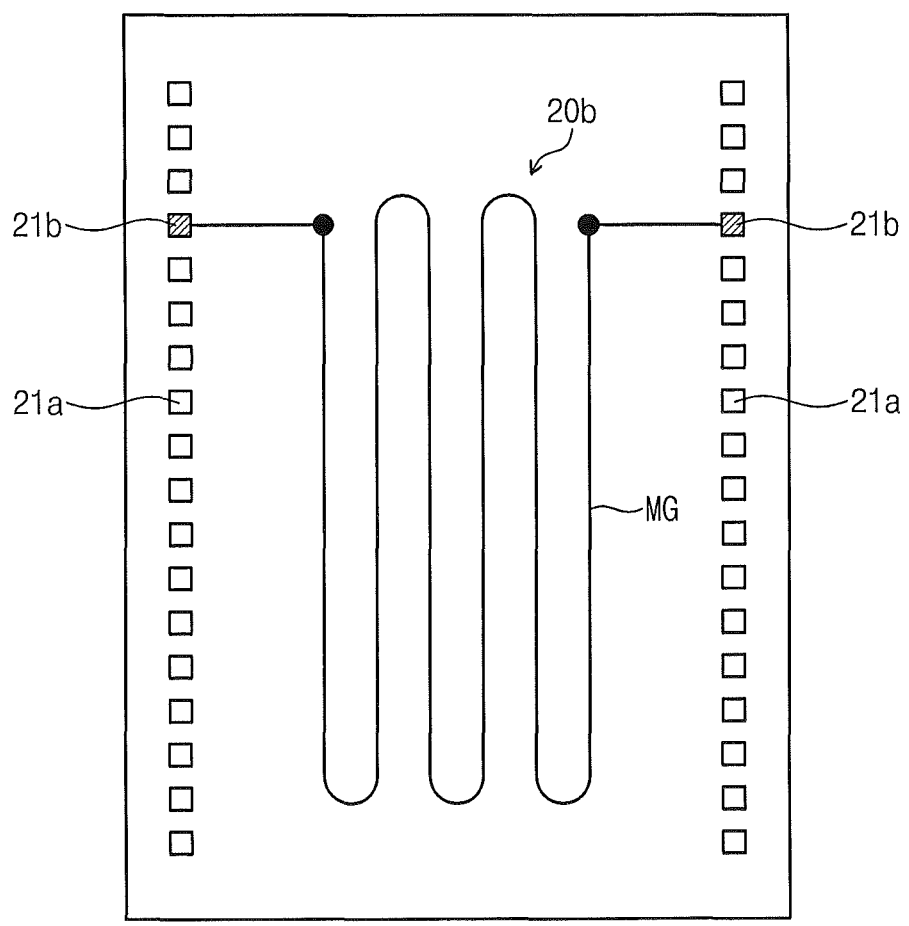

FIGS. 2A and 2B are views illustrating a measuring device of a semiconductor chip according to some embodiments of the inventive concept.

Referring to FIG. 2A, the measuring device 20b of the memory chip 20 according to some embodiments may measure the temperature of the memory chip 20 when the memory chip 20 is operated. In some embodiments, the measuring device 20b of the memory chip 20 may include a thermocouple having a measurement junction J at which metal patterns M1 and M2 (formed of different metal materials) contact each other. In detail, the measuring device 20b may include first and second metal patterns M1 and M2 that are formed on the memory device by a redistribution process. First-ends of the first and second metal patterns M1 and M2 may be electrically connected to the measuring pads 21b, respectively. The measuring device 20b may measure the temperature and/or strain of the memory chip 20 when the memory chip 20 is operated. The measured signals may be outputted through the measuring pads 21b. In more detail, electromotive force currents flowing through the first and second metal patterns M1 and M2 may occur in the thermocouple by differences between a temperature of the measurement junction J and temperatures of the first-ends of the first and second metal patterns M1 and M2. In other words, the temperature of the memory chip 20 may be measured by using a voltage difference between two measuring pads 21b.

For example, the first and second metal patterns M1 and M2 may be formed of copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), carbon (C), and/or any alloy thereof. In some embodiments, the first metal pattern M1 may be formed of copper (Cu), and the second metal pattern M2 may be formed of constantan (i.e., an alloy having copper of 60% and nickel of 40%). Other compositions of constantan may be used, in some embodiments, the first metal pattern M1 may be formed of nickel-chrome, and the second metal pattern M2 may be formed of nickel-aluminum.

Referring to FIG. 2B, the measuring device 20b of the memory chip 20 according to some embodiments may include a strain gauge including a metal grid MG connected between two measuring pads 21b. The metal grid MG may be formed using a redistribution process on the memory device 20a. Both ends of the metal grid MG may be electrically connected to the measuring pads 21b, respectively. The measuring device 20b may output a resistance value of the metal grid MG according to the strain of the semiconductor package 100 to the measuring pads 21b. In detail, a tensile pressure or a compressive pressure may be applied to the metal grid MG by the strain on the semiconductor package 100, and the resistance value of the metal grid MG may be increased or reduced according to the pressure (or force) applied to the metal grid MG. Thus, the amount of a current flowing through the metal grid MG connected between the two measuring pads 21b may be varied. In other words, the strain of the memory chip 20 may be measured according to the current variation between the two measuring pads 21b.

In some embodiments, the metal grid MG may be formed of copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), carbon (C), and/or any alloy thereof. For example, the metal grid MG may be formed of constantan, nichrome, karma, and/or manganin.

Figure 3:
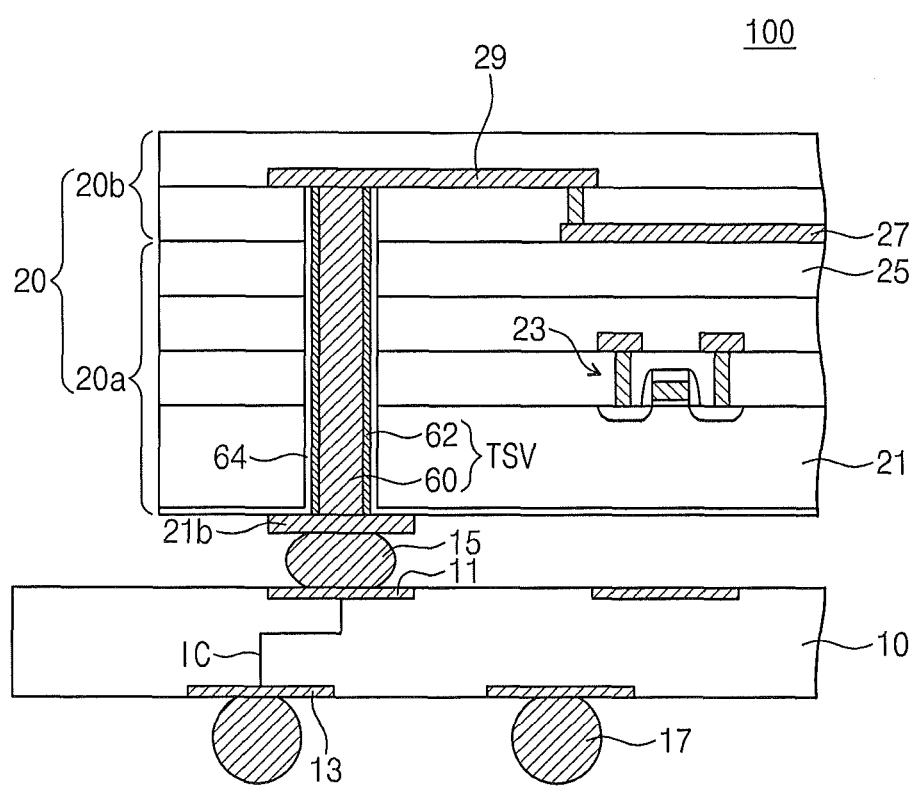
FIG. 3 is an enlarged view of a portion of a semiconductor package according to some embodiments of the inventive concept.

FIG. 3 is an enlarged view of a portion of a semiconductor package according to some embodiments of the inventive concept.

Referring to FIG. 3, the memory chip 20 includes the memory device 20a including the semiconductor substrate 21; and the measuring device 20b disposed on the memory device 20a, as described above. The semiconductor substrate 21 may have a first surface and a second surface opposite to each other. The memory device 20a may include various integrated circuit elements formed on the first surface of the semiconductor substrate 21. For example, the integrated circuit elements of the memory device 20a may include memory transistors 23, control transistors, and data storage elements which are formed on the first surface of the semiconductor substrate 21. An insulating layer 25 may be formed on the first surface of the semiconductor substrate 21 to cover the integrated circuit elements (e.g., the memory transistors 23, the control transistors, and the data storage elements) of the memory device 20a. The insulating layer 25 may include interconnection structures electrically connected to the integrated circuit elements of the memory device 20a. The integrated circuit elements of the memory device 20a may be electrically connected to the I/O pads 21a through the interconnection structures.

A redistribution pattern 27 may be formed on the insulating layer 25. The redistribution pattern 27 may be included in the measuring device 20b. The redistribution pattern 27 may be electrically connected to an inner measuring pad 29 electrically connected to the through-electrode TSV. In some embodiments, the redistribution pattern 27 may be formed using a redistribution process. The redistribution pattern 27 may include the first and second metal patterns M1 and M2 of the thermocouple described with reference to FIG. 2A or may include the metal grid MG of the strain gauge described with reference to FIG. 2B. For example, the redistribution pattern 27 may be formed of copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), carbon (C), and/or any alloy thereof.

The through-electrode TSV may penetrate the insulating layer 25 and the semiconductor substrate 21 and may be connected to the inner measuring pad 29. The through-electrode TSV may have a pillar shape and may be spaced apart from the memory transistors 23. The through-electrode TSV may include a barrier layer 60 and a metal layer 62. The barrier layer 60 may include titanium, titanium nitride, tantalum, tantalum nitride, ruthenium, cobalt, manganese, tungsten nitride, nickel, nickel boride, a double layer of titanium and titanium nitride, and/or a mixture layer different from the double layer. The barrier layer 60 may reduce or prevent metal atoms that otherwise could be diffused from the through-electrode TSV to the semiconductor substrate 21. The metal layer 62 may include silver (Ag), gold (Au), copper (Cu), aluminum (Al), tungsten (W), and/or indium (In). A via-insulating layer 64 may be disposed between the through-electrode TSV and the semiconductor substrate 21. For example, the via-insulating layer 64 may include at least one of silicon oxide, silicon oxynitride, and/or silicon nitride. Alternatively, the via-insulating layer may include a polymer layer.

The measuring pad 21b may be formed on the second surface of the semiconductor substrate 21. The measuring pad 21b of the memory chip 20 may be electrically connected to the bonding pad 11 of the package substrate 10 through the solder ball or the solder bump 15. The bonding pad 11 may be electrically connected to the external connecting pad 13 through the internal interconnection IC disposed within the package substrate 10. In other words, the signals measured in the measuring device 20b of the memory chip 20 may be outputted to an external device through the external connecting terminal 17.

Figure 4:
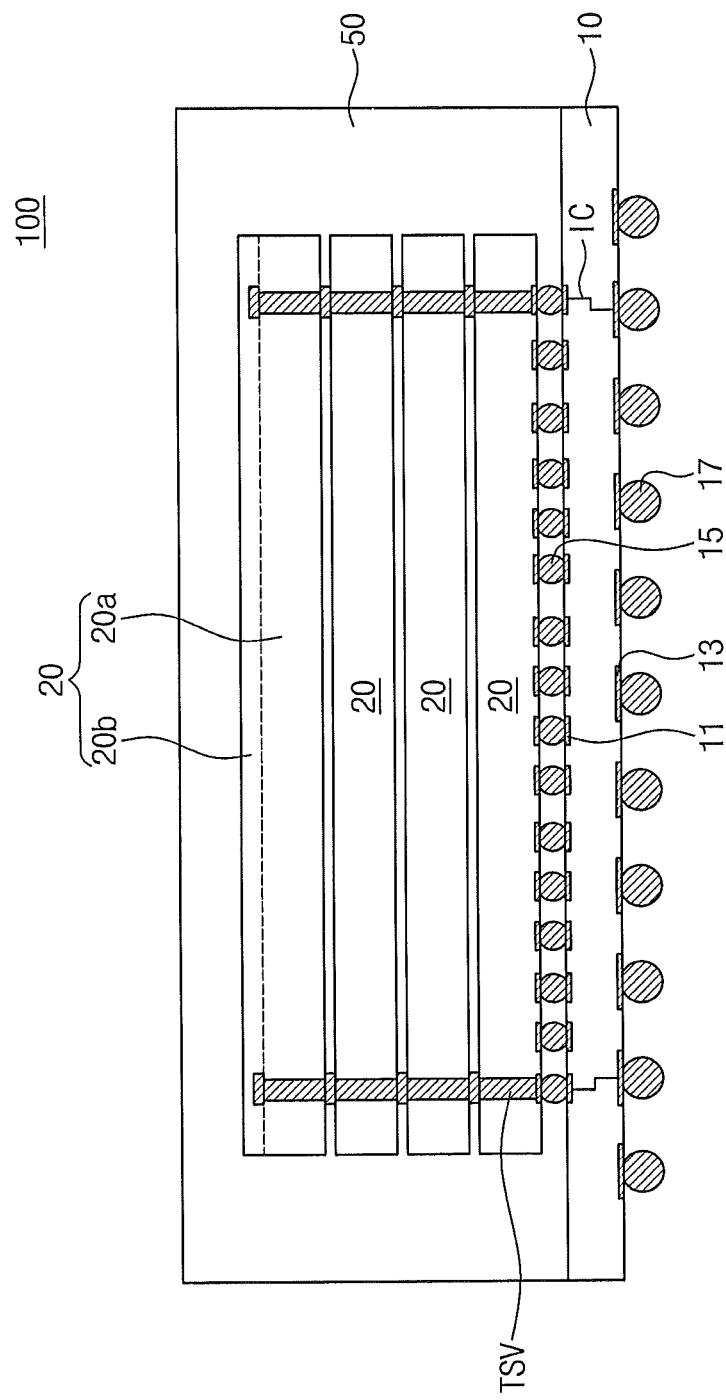
FIG. 4 is a cross-sectional view illustrating a semiconductor package according to some embodiments of the inventive concept.

FIG. 4 is a cross-sectional view illustrating a semiconductor package according to some embodiments of the inventive concept.

Referring to FIG. 4, a semiconductor package 100 may include a package substrate 10, a plurality of memory chips 20 stacked on the package substrate 10, and a molding layer 50.

In some embodiments, at least one of the memory chips 20 includes the memory device 20a including the semiconductor substrate and the measuring device 20b formed on the memory device 20a, as described with reference to FIGS. 1 to 3. In addition, the memory chip 20 may include I/O pads (see 21a of FIG. 2A) connected to the memory device 20a and measuring pads (see 21b of FIG. 2A) connected to the measuring device 20b. For example, the uppermost one of the stacked memory chips 20 may include the measuring device 20b. Alternatively, the lowest one of the stacked memory chips 20 may include the measuring device 20b. In still other embodiments, each of the memory chips 20 may include a respective measuring device 20*b* or a respective portion of the measuring device 20*b*.

The memory chips 20 may be mounted on the package substrate 10 by a flip chip-bonding technique, and the memory chips 20 may be electrically connected through through-electrodes TSV. In addition, the measuring device 20*b* of the uppermost memory chip 20 may be electrically connected to the bonding pad 11 of the package substrate 10 through a through-electrode TSV. The bonding pad 11 may be electrically connected to the external connecting pad 13 through the internal interconnection IC disposed within the package substrate 10.

Figure 5:
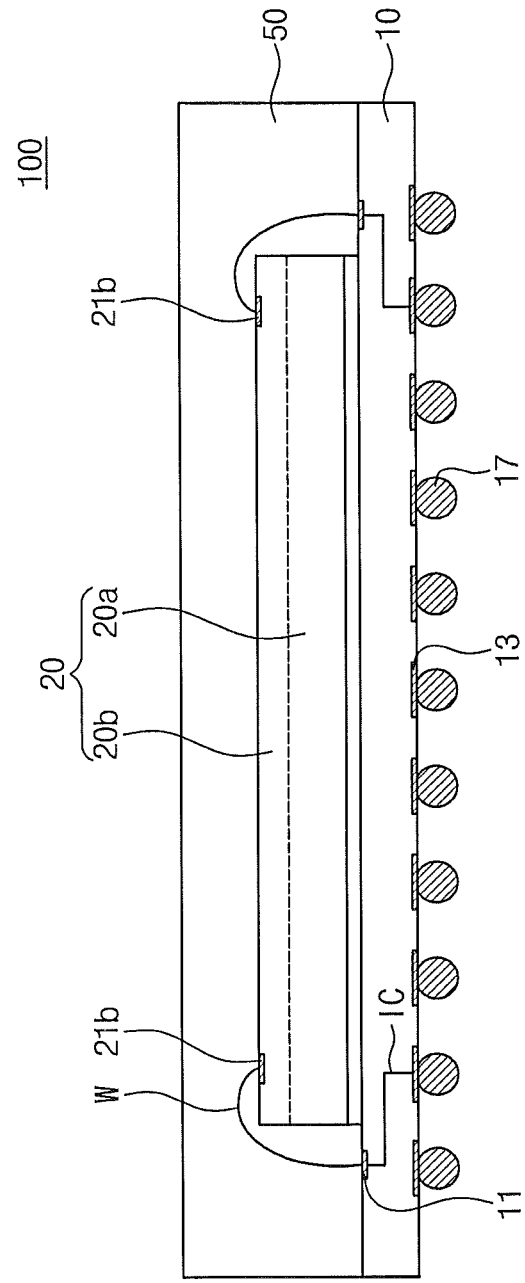
FIG. 5 is a cross-sectional view illustrating a semiconductor package according to some embodiments of the inventive concept.

FIG. 5 is a cross-sectional view illustrating a semiconductor package according to some embodiments of the inventive concept.

Referring to FIG. 5, a semiconductor package 100 may include a package substrate 10, a memory chip 20 mounted on the package substrate 10, and a molding layer 50 covering the memory chip 20.

The package substrate 10 may have a top surface and a bottom surface and may include bonding pads 11, internal interconnections IC, and external connecting pads 13. The bonding pads 11 may be arranged on the top surface of the package substrate 10, and the external connecting pads 13 may be arranged on the bottom surface of the package substrate 10. The bonding pads 11 may be electrically connected to the external connecting pads 13 through the internal interconnections IC. External connecting terminals 17 (e.g., solder balls or solder bumps) may be bonded to the external connecting pads 13.

In some embodiments, the memory chip 20 may be bonded to the top surface of the package substrate 10 using an adhesive layer. The memory chip 20 includes the memory device 20*a* and the measuring device 20*b*. The measuring device 20*b* may include the thermocouple or the strain gauge formed using the redistribution process, as described for example, with reference to FIGS. 2A and 2B. In addition, the memory chip 20 may further include measuring pads 21*b* connected to the measuring device 20*b* and I/O pads (see 21*a* of FIG. 2A) connected to the memory device 20*a*, as described for example, with reference to FIGS. 2A and 2B. In some embodiments, the measuring pads 21*b* and the I/O pads (see 21*a* of FIG. 2A) may be arranged on a top surface of the memory chip 20. The measuring pads 21*b* and the I/O pads may be electrically connected to the bonding pads 11 of the package substrate 10 through bonding wires W. Signals measured by the measuring device 20*b* of the memory chip 20 may be outputted to an external device through the external connecting terminals 17.

Figure 6:
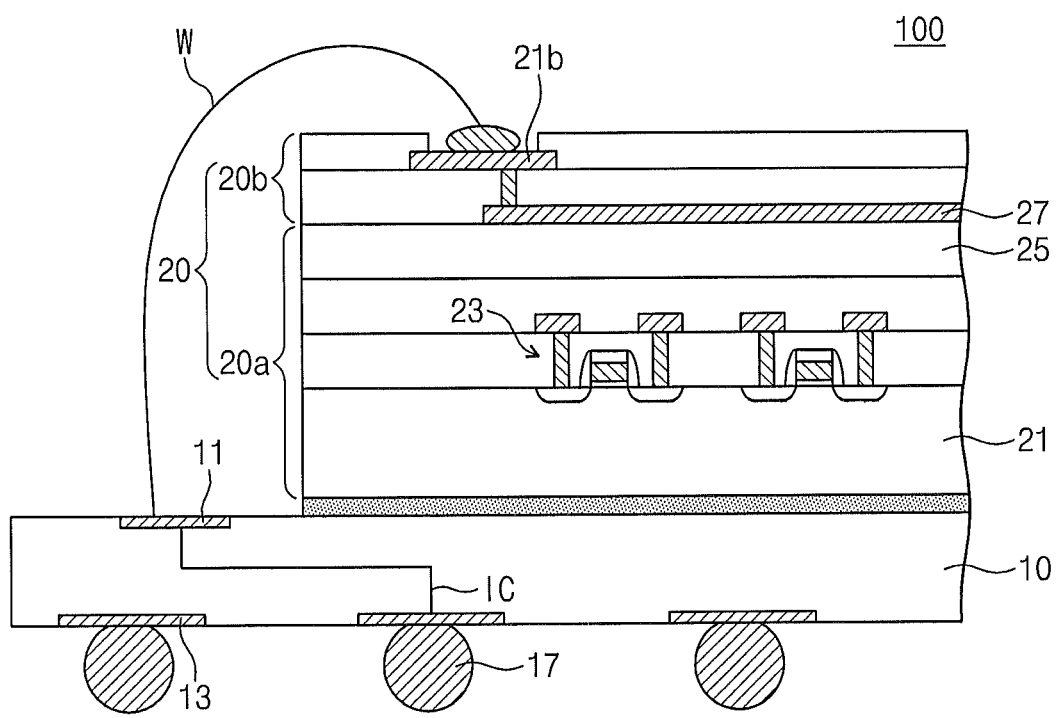
FIG. 6 is an enlarged view of a portion of a semiconductor package according to some embodiments of the inventive concept.

FIG. 6 is an enlarged view of a portion of a semiconductor package according to some embodiments of the inventive concept.

Referring to FIG. 6, the memory chip 20 includes the memory device 20*a* including the semiconductor substrate 21, and the measuring device 20*b* on the memory device 20*a*. Integrated circuit elements of the memory device 20*a* may be on the top surface of the semiconductor substrate 21. The integrated circuit elements of the memory device 20*a* may include memory transistors 23, control transistors, and data storage elements. An insulating layer 25 may be disposed on the top surface of the semiconductor substrate 21 to cover the integrated circuit elements of the memory device 20*a*. The insulating layer 25 may include interconnection structures electrically connected to the integrated circuit elements of the memory device 20*a*. The integrated circuit elements of the memory device 20*a* may be electrically connected to the I/O pads (see 21*a* of FIG. 2A) through the interconnection structures.

A redistribution pattern 27 included in the measuring device 20*b* may be formed on the insulating layer 25. The redistribution pattern 27 may be electrically connected to the measuring pad 21*b*. The redistribution pattern 27 may be formed using a redistribution process. For example, the redistribution pattern 27 may be formed of copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), carbon (C), and/or any alloy thereof. The redistribution pattern 27 may include the first and second metal patterns M1 and M2 of the thermocouple described with reference to, for example, FIG. 2A or may include the metal grid MG of the strain gauge described with reference to, for example, FIG. 2B.

In some embodiments, the measuring pad 21*b* may be exposed by a passivation layer disposed at an uppermost portion of the memory chip 20 for electrical connection between the package substrate 10 and the measuring pad 21*b*. The measuring pad 21*b* may be electrically connected to the bonding pad 11 of the package substrate 10 through the bonding wire W. The bonding pad 11 may be electrically connected to the external connecting pad 13 through the internal interconnection IC disposed within the package substrate 10. The external connecting pad 13 may be electrically connected to an external device through the external connecting terminal 17.

Figure 7:
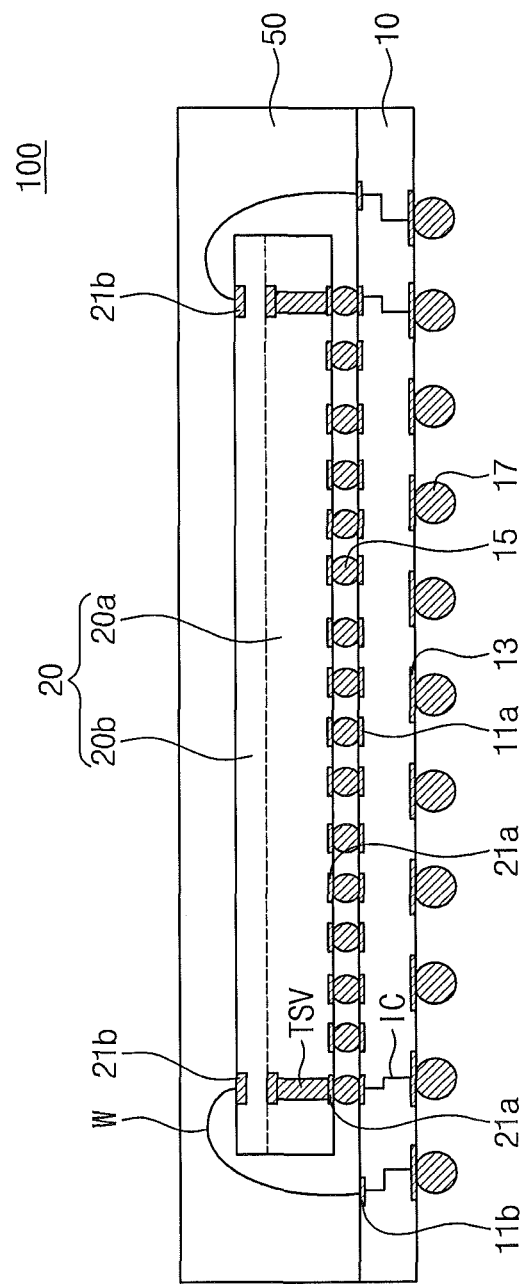
FIG. 7 is a cross-sectional view illustrating a semiconductor package according to some embodiments of the inventive concept.

FIG. 7 is a cross-sectional view illustrating a semiconductor package according to some embodiments of the inventive concept.

Referring to FIG. 7, a semiconductor package 100 may include a package substrate 10, a memory chip 20 mounted on the package substrate 10, and a molding layer 50 covering the memory chip 20.

The memory chip 20 includes the memory device 20*a* and the measuring device 20*b*. The measuring device 20*b* may include the thermocouple described, for example, with reference to FIG. 2A or the strain gauge described, for example, with reference to FIG. 2B. In addition, the memory chip 20 includes measuring pads 21*b* connected to the measuring device 20*b* and I/O pads 21*a* connected to the memory device 20*a*, as described, for example, with reference to FIG. 2A or 2B.

In the present embodiment, the I/O pads 21*a* may be disposed on the bottom surface of the memory chip 20, and the measuring pads 21*b* may be disposed on the top surface of the memory chip 20. The I/O pads 21*a* may be electrically connected to the memory device 20*a*, and the measuring pads 21*b* may be electrically connected to the measuring device 20*b*. In addition, at least one of the I/O pads 21*a* of the memory chip 20 may be electrically connected to the memory device 20*a* through a through-electrode TSV. The I/O pads 21*a* of the memory chip 20 may be electrically connected to first bonding pads 11*a* of the package substrate 10 through bumps 15. The measuring pads 21*b* of the memory chip 20 may be electrically connected to second bonding pads 11*b* of the package substrate 10 through bonding wires W.

Figure 8:
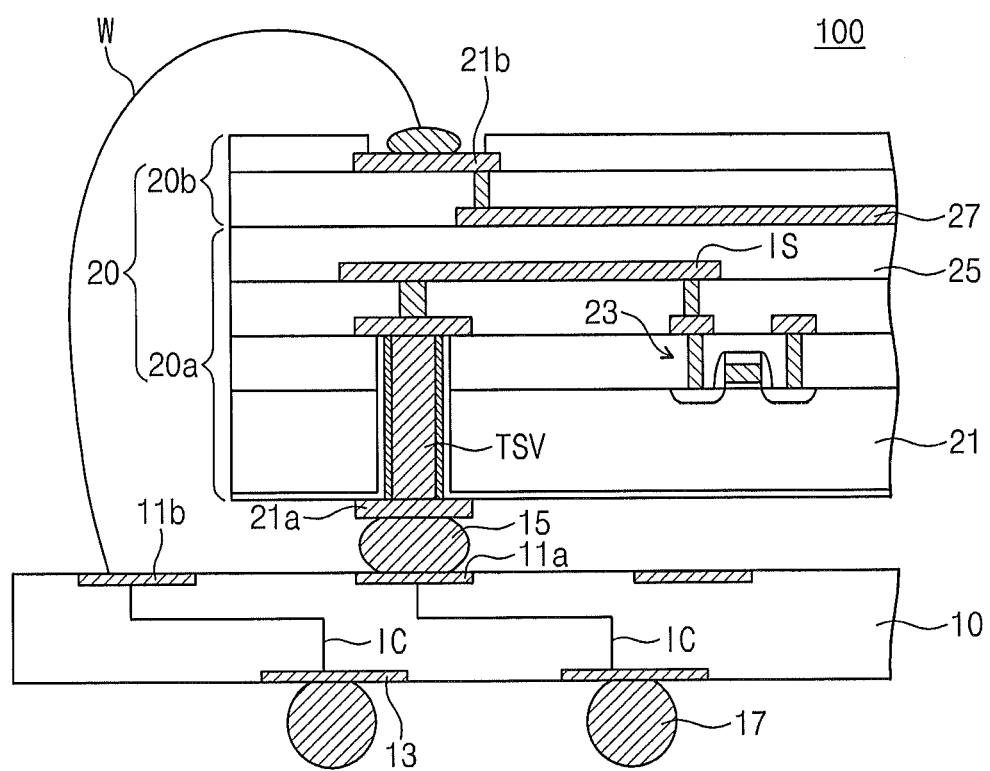
FIG. 8 is an enlarged view of a portion of a semiconductor package according to some embodiments of the inventive concept.

FIG. 8 is an enlarged view of a portion of a semiconductor package according to some embodiments of the inventive concept.

Referring to FIG. 8, a semiconductor substrate 21 may have a first surface and a second surface opposite to each other. Integrated circuit elements of the memory device 20*a* may be formed on the first surface of the semiconductor substrate 21. For example, the integrated circuit elements of the memory device 20a may include memory transistors 23, control transistors, and data storage elements which are formed on the first surface of the semiconductor substrate 21. An insulating layer 25 may be disposed on the first surface of the semiconductor substrate 21 to cover the memory transistors 23, the control transistors, and the data storage elements. The insulating layer 25 may include interconnection structures electrically connected to the integrated circuit elements of the memory device 20a. The integrated circuit elements of the memory device 20a may be electrically connected to the through-electrode TSV through the interconnections IC. The I/O pad 21a may be disposed on the second surface of the semiconductor substrate 21 so as to be electrically connected to the through-electrode TSV. The I/O pad 21a of the memory chip 20 may be electrically connected to the first bonding pad 11a of the package substrate 10 through the solder ball or solder bump 15.

A redistribution pattern 27 included in the measuring device 20b may be formed on the insulating layer 25 covering the integrated circuit elements of the memory device 20a. The redistribution pattern 27 may be formed using a redistribution process. The redistribution pattern 27 may include the first and second metal patterns M1 and M2 of the thermocouple described, for example, with reference to FIG. 2A or may include the metal grid MG of the strain gauge described, for example, with reference to FIG. 2B. The redistribution pattern 27 may be electrically connected to the measuring pad 21b that is exposed by a passivation layer. The measuring pad 21b may be electrically connected to the second bonding pad 11b of the package substrate 10 through the bonding wire W. The bonding pad 11b may be electrically connected to the external connecting pad 13 through an internal interconnection IC disposed within the package substrate 10, and the external connecting pad 13 may be electrically connected to an external device through the external connecting terminal 17.

Figure 9:
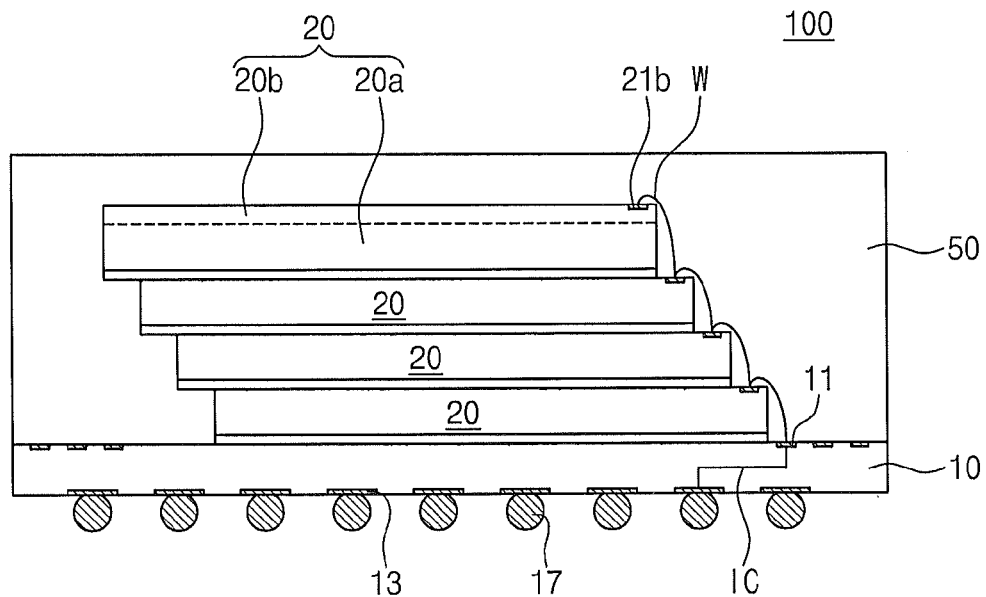
FIG. 9 is a cross-sectional view illustrating a semiconductor package according to some embodiments of the inventive concept.

FIG. 9 is a cross-sectional view illustrating a semiconductor package according to some embodiments of the inventive concept.

Referring to FIG. 9, a semiconductor package 100 may include a plurality of memory chips 20 stacked on a package substrate 10 and a molding layer 50. In the present embodiment, the memory chips 20 may be stacked in a cascade (or staircase) pattern or in a staggered zigzag pattern on the package substrate 10. The memory chips 20 may be electrically connected to bonding pads 11 of the package substrate 10 through bonding wires W. At least one of the memory chips 20 may include a memory device 20a and a measuring device 20b. For example, the uppermost one of the stacked memory chips 20 may include the measuring device 20b. In addition, the memory chip 20 may include I/O pads 21a electrically connected to the memory device 20a and measuring pads 21b electrically connected to the measuring device 20b. The measuring pads 21b connected to the measuring device 20b may be electrically connected to some of the bonding pads 11 of the package substrate 10 through some of the bonding wires W. The bonding pads 11 may be electrically connected to external connecting pads 13 through internal interconnections IC disposed within the package substrate 10.

Figure 10:
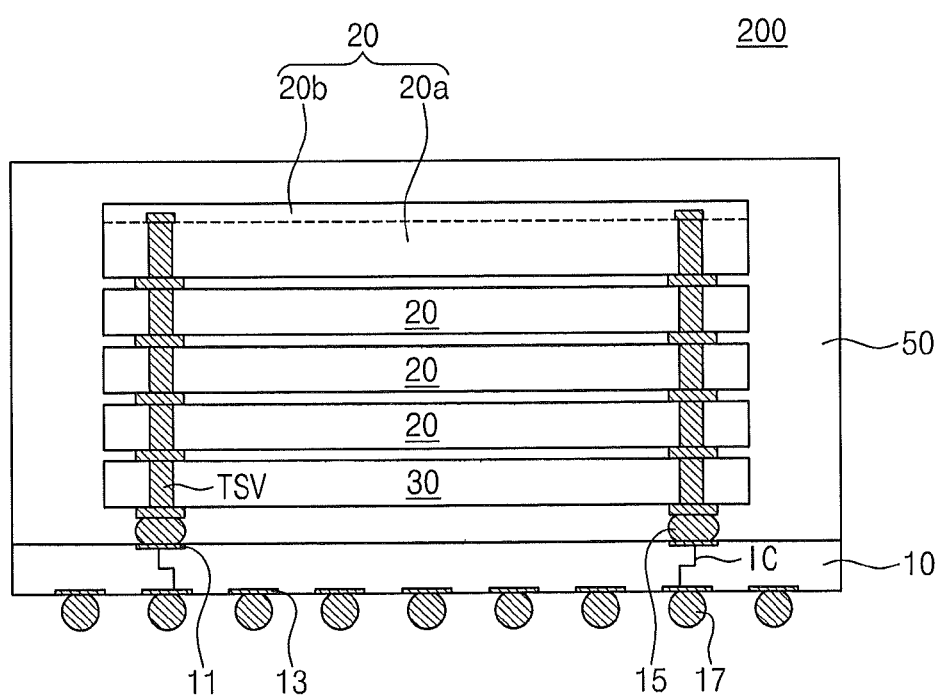
FIGS. 10, 11 and 12 are cross-sectional views illustrating multi-chip semiconductor packages according to some embodiments of the inventive concept.
Figure 11:
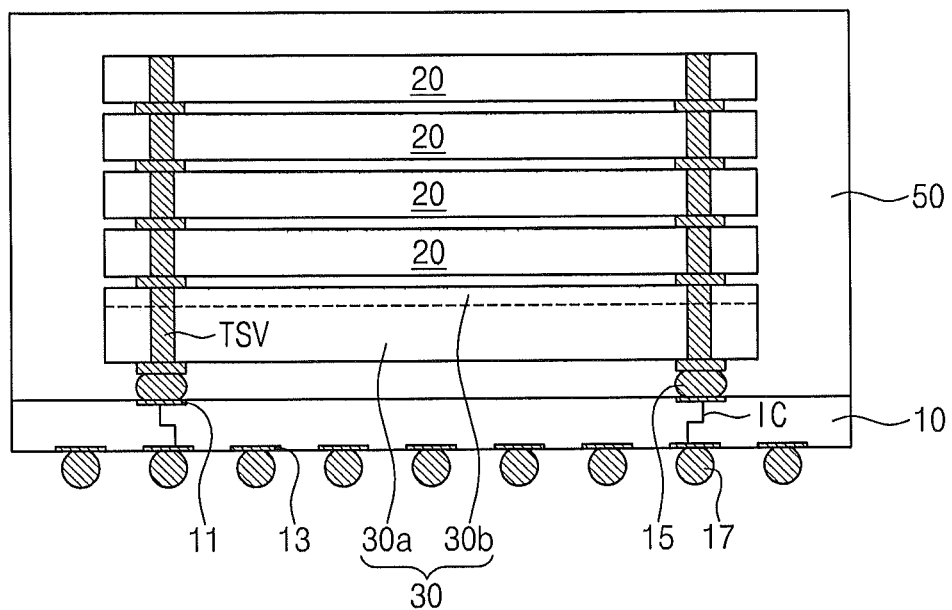
Figure 12:
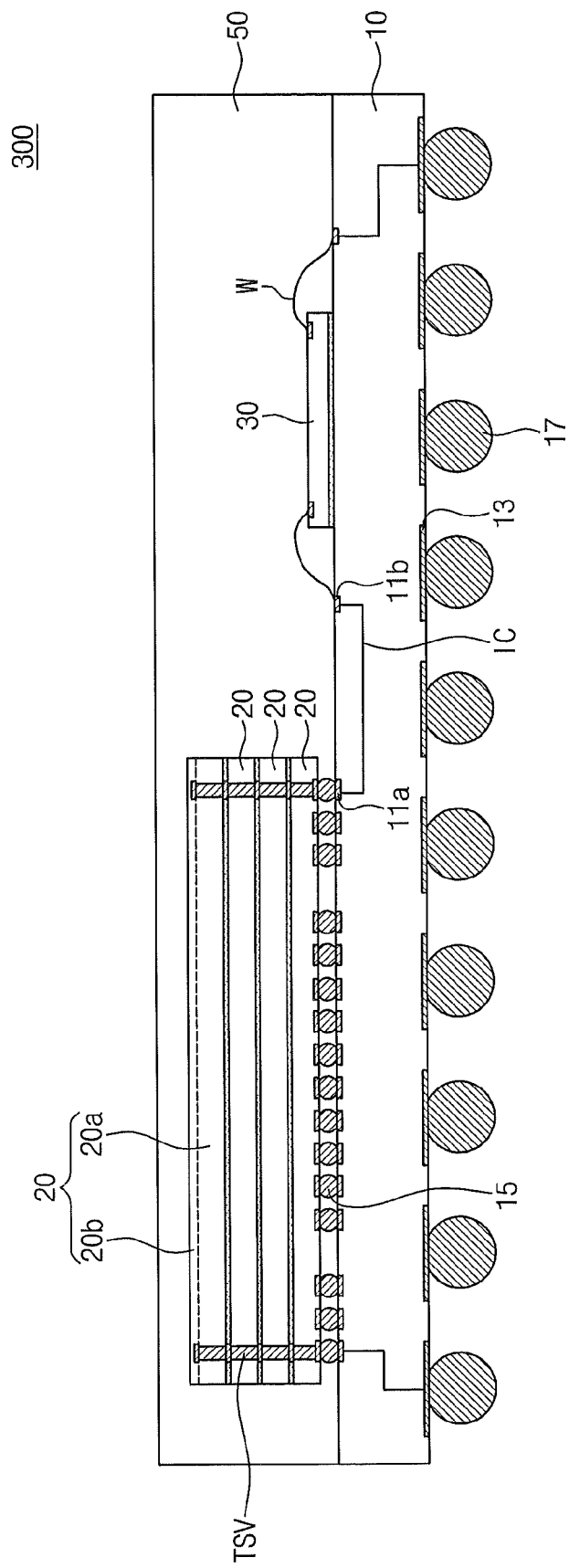

FIGS. 10, 11 and 12 are cross-sectional views illustrating multi-chip semiconductor packages according to some embodiments of the inventive concept.

Referring to FIGS. 10 and 11, a multi-chip semiconductor package 200 may include a controller chip 30 mounted on a package substrate 10 and a plurality of memory chips 20 stacked on the controller chip 30.

The package substrate 10 may have a top surface and a bottom surface and may include bonding pads 11, internal interconnections IC, and external connecting pads 13. The bonding pads 11 may be arranged on the top surface of the package substrate 10, and the external connecting pads 13 may be arranged on the bottom surface of the package substrate 10. The bonding pads 11 may be electrically connected to the external connecting pads 13 through the internal interconnections IC. External connecting terminals 17 (e.g., solder balls or solder bumps) may be bonded to the external connecting pads 13.

The controller chip 30 may be mounted on the package substrate 10 using a flip chip-bonding technique. The controller chip 30 may include a plurality of through-electrodes TSV connected to the package substrate 10 through bumps 15. The controller chip 30 may be electrically connected to the memory chips 20 through its through-electrodes TSV.

Each of the memory chips 20 may include a plurality of through-electrodes TSV and may be electrically connected to the controller chip 30 through its through-electrode TSV.

According to FIG. 10, at least one of the memory chips 20 may include a memory device 20a and a measuring device 20b. For example, the uppermost one of the stacked memory chips 20 may include the memory device 20a and the measuring device 20b. In detail, as described for example, with reference to FIGS. 7 and 8, the memory chip 20 may include the memory device 20a including integrated circuit elements formed on a semiconductor substrate 10 and an insulating layer covering the integrated circuit elements, and the measuring device 20b formed on the insulating layer of the memory device 20a. The measuring device 20b may include a redistribution pattern formed using a redistribution process. For example, the measuring device 20b may include the thermocouple described with reference to FIG. 2A or the strain gauge described with reference to FIG. 2B. The memory chip 20 may further include measuring pads 21b connected to the measuring device 20b and I/O pads 21a connected to the memory device 20a.

In some embodiments, the measuring device 20b may include the thermocouple having a junction at which two different kinds of metal patterns contact each other. A temperature of the memory chip 20 may be measured at the junction of the thermocouple, and the measured signal outputted through the measuring pads 21b may be transmitted to the controller chip 30 through the through-electrodes TSV. The controller chip 30 may compare the temperature of the memory chip 20 obtained by the measured signal with a reference temperature, and control an operating speed of the memory chip 20 according to the temperature of the memory chip 20.

According to FIG. 11, a controller chip 30 may include a logic device 30a including integrated circuit elements formed on a semiconductor substrate 10, and a measuring device 30b formed on the logic device 30a. A multi-chip semiconductor package 200 may output a measured signal according to physical variation (e.g., a temperature and/or strain) of the controller chip 30 when the controller chip 30 is operated. The plurality of memory chips 20 may be stacked on the controller chip 30 including the measuring device 30b. Alternatively, the controller chip 30 may be stacked on the uppermost one of the stacked memory chips 20. In still other embodiments, each of the controller chip 30 and the memory chips 20 may include the measuring device 30b or a portion of the measuring device 30b.

Referring to FIG. 12, a multi-chip semiconductor package 300 may include a controller chip 30 mounted on a package substrate 10 and a plurality of memory chips 20 stacked on the package substrate 10 at a side of the controller chip 30.

The package substrate 10 may have a top surface and a bottom surface and may include first and second bonding pads 11a and 11b, internal interconnections IC, and external connecting pads 13. The first and second bonding pads 11a and 11b may be arranged on the top surface of the package substrate 10, and the external connecting pads 13 may be arranged on the bottom surface of the package substrate 10. The first and second bonding pads 11a and 11b may be electrically connected to each other through the internal interconnections IC. In addition, the first and second bonding pads 11a and 11b may be electrically connected to the external connecting pads 13. External connecting terminals 17 (e.g., solder balls or solder bumps) may be bonded to the external connecting pads 13.

The memory chips 20 may be mounted on the package substrate 10 by a flip chip-bonding technique, and the memory chips 20 may be electrically connected to each other by through-electrodes TSV. In some embodiments, at least one of the memory chips 20 may include a memory device 20a and a measuring device 20b. In some embodiments, the measuring device 20b includes a redistribution pattern formed using a redistribution process. For example, the measuring device 20b may include the thermocouple described with reference to FIG. 2A or the strain gauge described with reference to FIG. 2B. In addition, the memory chip 20 further includes measuring pads 21b connected to the measuring device 20b and I/O pads 21a connected to the memory device 20a.

The controller chip 30 may be electrically connected to the second bonding pads 11b of the package substrate 10 through bonding wires W. The measured signal outputted from the measuring device 20b may be transmitted to the controller chip 30 through the internal interconnections IC disposed within the package substrate 10. In some embodiments, a temperature of the memory chip 20 may be measured by the measuring device 20b, and the controller chip 30 may compare the temperature of the memory chip 20 obtained using the measured signal with a reference temperature, and control an operating speed of the memory chip 20 according to the temperature of the memory chip 20.

In some embodiments, the measuring device 20b may be included in the controller chip 30 including a logic device, as described with reference to FIG. 11. In this case, physical variation of the controller chip 30 may be measured by the measuring device 20b when the controller chip is operated, so an operating speed of the controller chip 30 may be controlled according to the measured signal.

Figure 13:
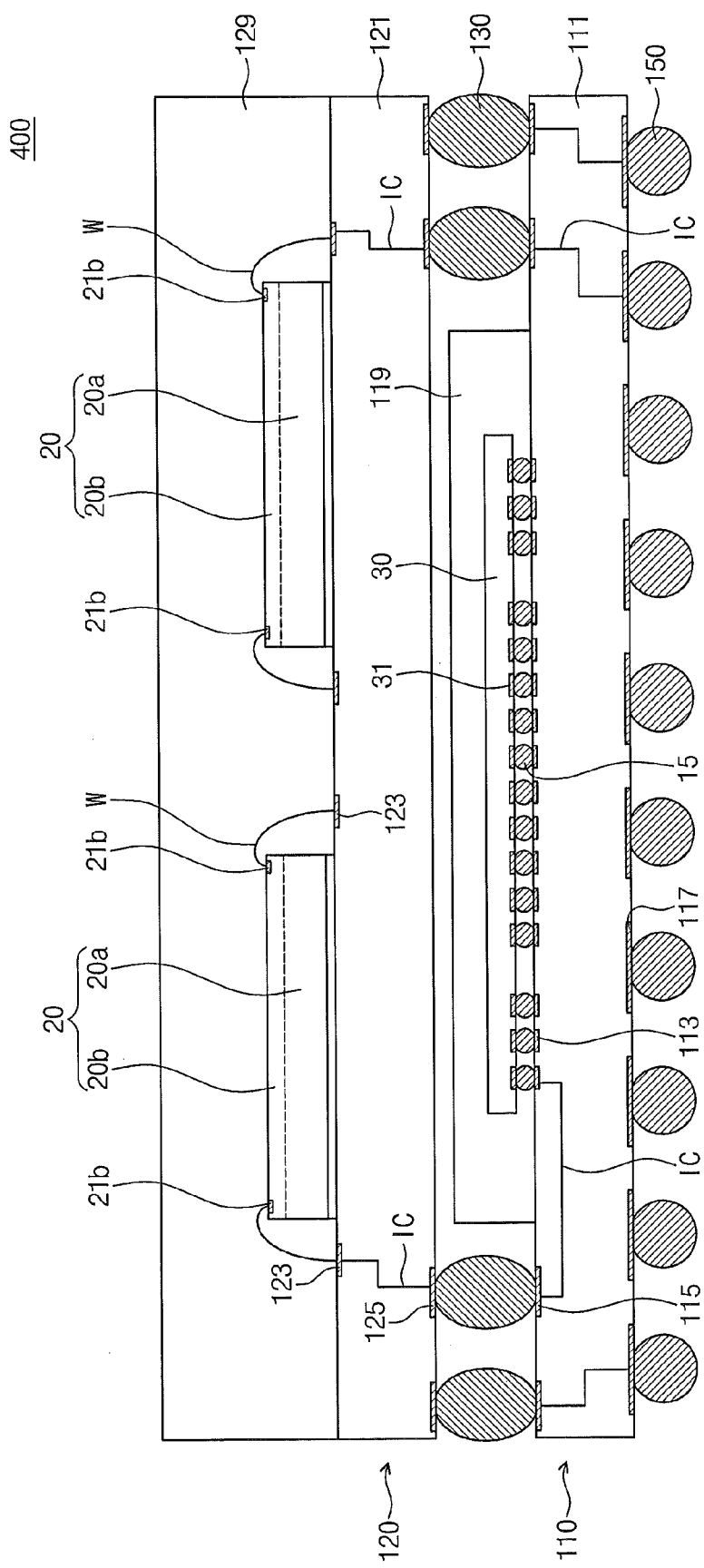
FIG. 13 is a cross-sectional view illustrating a stack-type semiconductor package according to some embodiments of the inventive concept.

FIG. 13 is a cross-sectional view illustrating a stack-type semiconductor package according to some embodiments of the inventive concept.

Referring to FIG. 13, a stack-type semiconductor package 400 may include a first semiconductor package 110 and a second semiconductor package 120 stacked on the first semiconductor package 110.

The first semiconductor package 110 may include a controller chip 30 mounted on a first package substrate 111, and the second semiconductor package 120 may include memory chips 20 mounted on a second package substrate 121.

The controller chip 30 may be connected to the first package substrate 111 by a wire-bonding technique or a flip chip-bonding technique. The controller chip 30 may be mounted on the first package substrate 111 by the flip chip-bonding technique. In other words, data pads may be disposed on a bottom surface of the controller chip 30. The data pads 31 may be bonded to bonding pads 113 of the first package substrate 111 through bumps 15, so the controller chip 30 may be mounted on the first package substrate 111.

External connecting pads 117 may be arranged on a bottom surface of the first package substrate 111. Connecting pads 115 and the bonding pads 113 may be disposed on a top surface of the first package substrate 111. The connecting pads 115 may be electrically connected to the bonding pads 113 through internal interconnections IC disposed within the first package substrate 111. Interconnecting terminals 130 (e.g., solder balls or solder bumps) may be bonded to the connecting pads 115. External connecting terminals 150 (e.g., solder balls or solder bumps) may be bonded to the external connecting pads 117.

The first semiconductor package 110 may further include a first molding layer 119 covering the controller chip 30. In some embodiments, the first molding layer 119 may become an underfill disposed between the first package substrate 111 and the controller chip 30. The first molding layer 119 may include an epoxy molding compound. The first molding layer 119 may expose the connecting pads 115 of the first package substrate 111.

A plurality of the memory chips 20 may be connected to the second package substrate 121 by a wire-bonding technique. In some embodiments, the memory chips 20 may be sequentially stacked on the second package substrate 121, as described with reference to FIGS. 10, 11 and 12. Each of the memory chips 20 may include the memory device 20a and the measuring device 20b. The measuring device 20b may be electrically connected to measuring pads 21b. The measuring pads 21b may be electrically connected to bonding pads 123 of the second package substrate 121 through bonding wires W or through-electrodes TSV. The measuring device 20b includes a redistribution pattern formed using a redistribution process. For example, the measuring device 20b may include the thermocouple device 20b described with reference to FIG. 2A or the strain gauge described with reference to FIG. 2B.

The bonding pads 123 of the second package substrate 121 may be electrically connected to connecting pads 125 disposed on a bottom surface of the second package substrate 121 through internal interconnections IC disposed within the second package substrate 121. The connecting pads 125 of the second package substrate 121 may be electrically connected to the connecting pads 115 of the first package substrate 111 through the interconnecting terminals 130.

The second semiconductor package 120 may further include a second molding layer 129 covering the memory chips 20. In some embodiments, the second molding layer 129 may become an underfill disposed between the second package substrate 121 and the memory chips 20. The second molding layer 129 may include an epoxy molding compound.

Physical variation of the memory chips 20 may be measured by the measuring devices 20b of the memory chips 20 included in the second semiconductor package 120. Signals measured from the measuring devices 20b may be transmitted to the controller chip 30. In other embodiments, a measuring device 20b may be included in the controller chip 30 having a logic device. In this case, physical variation of the controller chip 30 may be measured by the measuring device when the controller chip 30 is operated, so an operating speed of the controller chip 30 may be controlled according to the measured signal.

Figure 14:
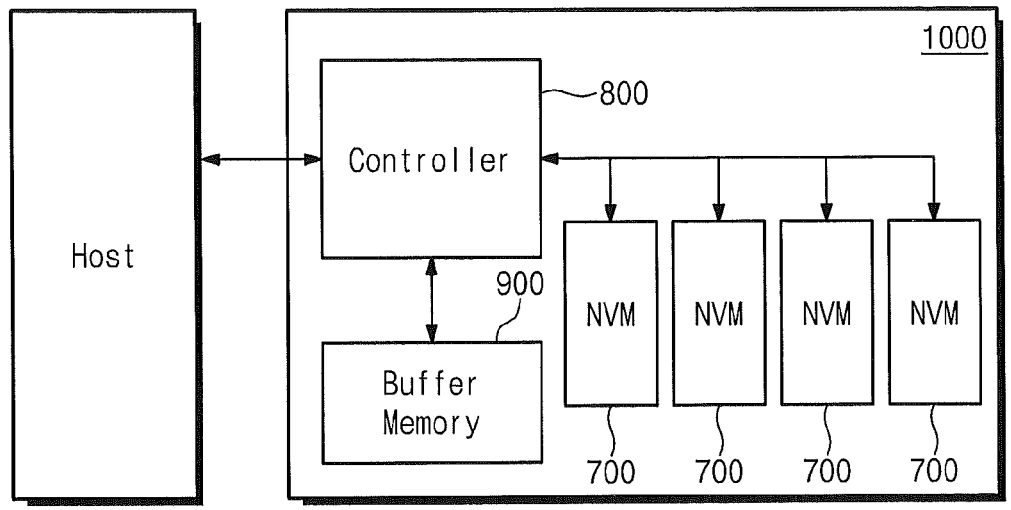
FIGS. 14 and 15 are schematic block diagrams illustrating data storage devices according to some embodiments of the inventive concept.
Figure 15:
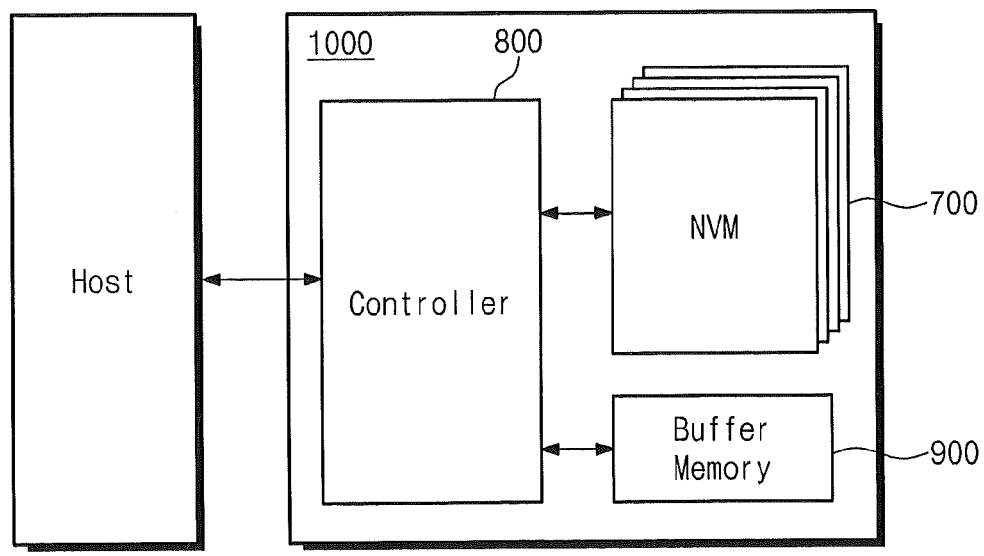

FIGS. 14 and 15 are schematic block diagrams illustrating data storage devices according to some embodiments of the inventive concept.

Referring to FIGS. 14 and 15, a data storage device 1000 may include a plurality of semiconductor memory packages 700, a buffer semiconductor memory package 900, and a controller 800.

The data storage device 1000 may exchange data with a host through input/output (I/O) ports. The data storage device 1000 may store data in or read data from the semiconductor memory packages 700 in response to write/read request of the host. The host may provide the write request of data to the data storage device 1000. The host may provide data and addresses corresponding to the data during the write request. The host may provide the read request of data to the data storage device 1000. The data storage device 1000 may be a solid state drive (SSD) or a memory card.

According to FIG. 14, the plurality of semiconductor memory packages 700 may be mounted on a top surface of a module board and may be controlled by the controller 800. According to FIG. 15, the plurality of semiconductor memory packages 700 may constitute one semiconductor package.

According to embodiments of the inventive concept, the semiconductor memory packages 700 may include a non-volatile memory device (NVM) that retains its data even when its power supply is interrupted, and a measuring device measuring physical variation of the semiconductor memory package 700. The non-volatile memory device may be a NAND-type flash memory device having large capacity and high-speed storage ability. Alternatively, the non-volatile memory device may be a PRAM device, a MRAM device, a ReRAM device, a FRAM device, or a NOR flash memory device. The measuring device may output a measured signal according to temperature variation and/or strain of the semiconductor memory package 700. For example, the measuring device may include the thermocouple described with reference to FIG. 2A or the strain gauge described with reference to FIG. 2B. The semiconductor memory package 700 may be one of the semiconductor packages 100 described with reference to FIGS. 1 to 3 and 5 to 8. If the plurality of semiconductor memory packages 700 is realized as one semiconductor package, the data storage device 1000 may include at least one of the semiconductor packages 100 described with reference to FIGS. 4 and 9.

The buffer semiconductor memory package 900 may temporarily store data transmitted between the controller 800 and the semiconductor memory packages 700 and data transmitted between the controller 800 and the host. The buffer semiconductor memory package 900 may include a randomly accessible memory device such as a DRAM device or a SRAM device.

The controller 800 may connect the data storage device 1000 to the host. In other words, the controller 800 may interface with the data storage device 1000 in response to a bus format of the host. The bus format of the host may be a universal serial bus (USB), a peripheral component interconnection (PCI) express, a serial ATA (SATA), or a parallel ATA (PATA). Signals (e.g., command signals, address signals, and data) may be transmitted between controller 800 and the host. The controller 800 may write data in or read data from a corresponding semiconductor memory package 700 in response to the command signal of the host.

According to embodiments of the inventive concept, the controller 800 may control the semiconductor memory package 700 in response to the measured signal outputted through the measuring device included in the semiconductor memory package 700. In detail, if the measuring device includes the thermocouple described with reference to FIG. 2A, the electromotive force flowing currents through the first and second metal patterns M1 and M2 may occur in the thermocouple by the differences between a temperature of the measurement junction J and the temperatures of the one-ends of the first and second metal patterns M1 and M2. In other words, the controller 800 may measure the temperature of the semiconductor memory package 700 using the voltage difference between two measuring pads (see 21b of FIG. 2A) in real time. In addition, the controller 800 may compare the measured temperature with a reference temperature, and control operation of the semiconductor memory package 700. In other embodiments, if the measuring device includes the strain gauge described, for example, with reference to FIG. 2B, the controller 800 may sense a variation of a current flowing the metal grid MG connected to two measuring pads (see 21b of FIG. 2B). The controller 800 may control the operation of the semiconductor memory package 700 according to the sensed current amount.

Figure 16:
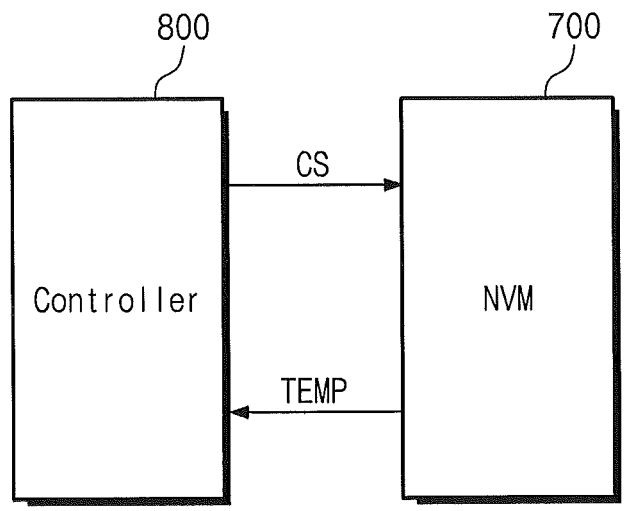
FIG. 16 is a schematic block diagram illustrating methods of controlling a data storage device according to some embodiments of the inventive concept.

FIG. 16 is a schematic block diagram for explaining methods of controlling data storage devices according to some embodiments of the inventive concept.

Referring to FIG. 16, a measured signal TEMP may be transmitted from the semiconductor memory package 700 including the memory device and the measuring device to the controller 800. In some embodiments, the semiconductor memory package 700 may include the thermocouple as the measuring device, and the measured signal TEMP outputted from the thermocouple may be provided to the controller 800. The controller 800 may measure the temperature of the semiconductor memory package 700 using the measured signal TEMP (e.g., the voltage difference) in real time. In some embodiments, the semiconductor memory package may include the strain gauge as the measuring device, and the measured signal TEMP (e.g., the current amount) outputted from the strain gauge may be provided to the controller 800. The controller 800 may transmit a control signal CS for controlling the operation of the semiconductor memory package 700 to the semiconductor memory package 700 in response to the measured signal TEMP.

Figure 17:
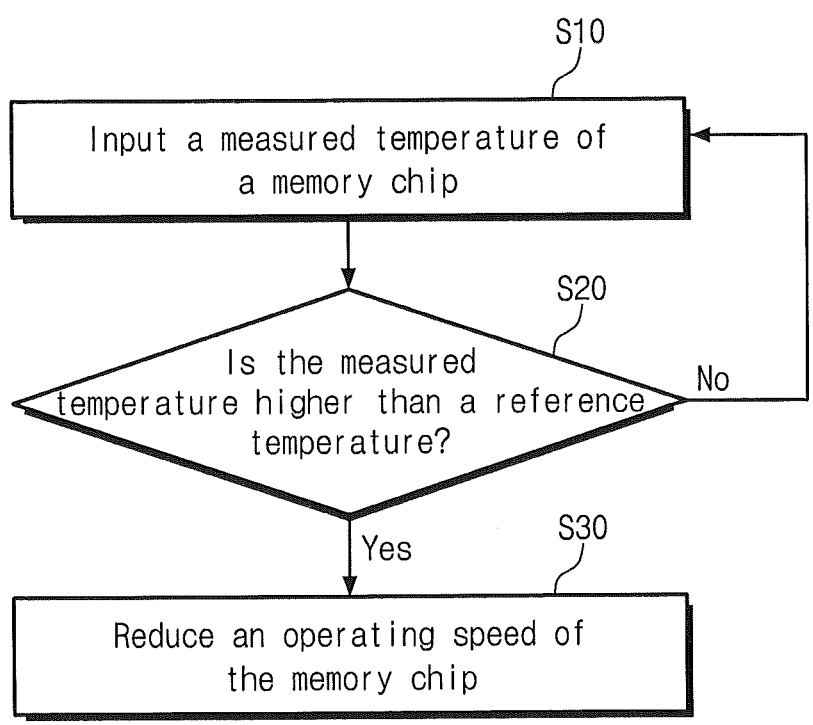
FIG. 17 is a graph illustrating temperature variation of a memory chip in a data storage device according to some embodiments of the inventive concept.
Figure 18:
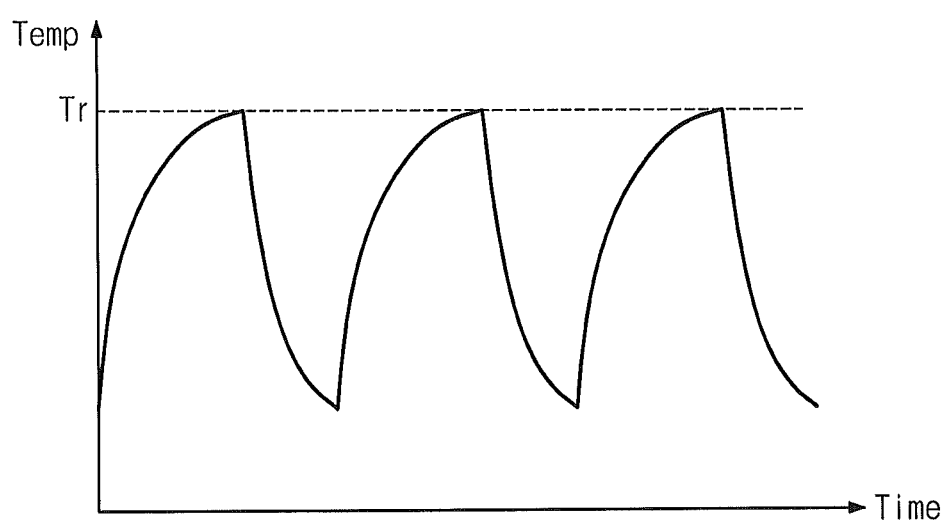
FIG. 18 is a flowchart illustrating methods of controlling a data storage device according to some embodiments of the inventive concept.

FIG. 17 is a flowchart illustrating methods of controlling data storage devices according to some embodiments of the inventive concepts FIG. 18 is a graph illustrating temperature variation of a memory chip in a data storage device according to some embodiments of the inventive concept.

As illustrated in FIG. 18, the semiconductor memory package may be operated, so the temperature of the semiconductor memory package may be increased. The temperature of the semiconductor package may be measured by the measuring device integrated within the semiconductor memory package in real time. The temperature of the semiconductor memory package may be controlled to be equal to or less than a reference temperature Tr by the controller.

In more detail, as illustrated in FIG. 17, the temperature measured from the semiconductor memory package in real time may be inputted to the controller (S10). The measured temperature inputted into the controller may be compared with the reference temperature (S20). If the measured temperature is higher than the reference temperature, the controller may reduce the operating speed of the semiconductor memory package (S30). Thus, the temperature of the semiconductor memory package may become lower than the reference temperature. For example, the controller may reduce a clock frequency of the semiconductor memory package and/or a current amount supplied to the semiconductor memory package to reduce the temperature generated from the semiconductor memory package. If the measured temperature is equal to or lower than the reference temperature, the operating speed of the semiconductor memory package may be maintained and the temperature of the semiconductor memory package may be continuously measured. According to embodiments of the inventive concept, the temperature of the semiconductor memory package may be measured in real time, and the aforementioned steps may be continuously repeated while the data storage device is operated. Thus, the temperature of the semiconductor memory package may repeatedly rise and fall.

Figure 19:
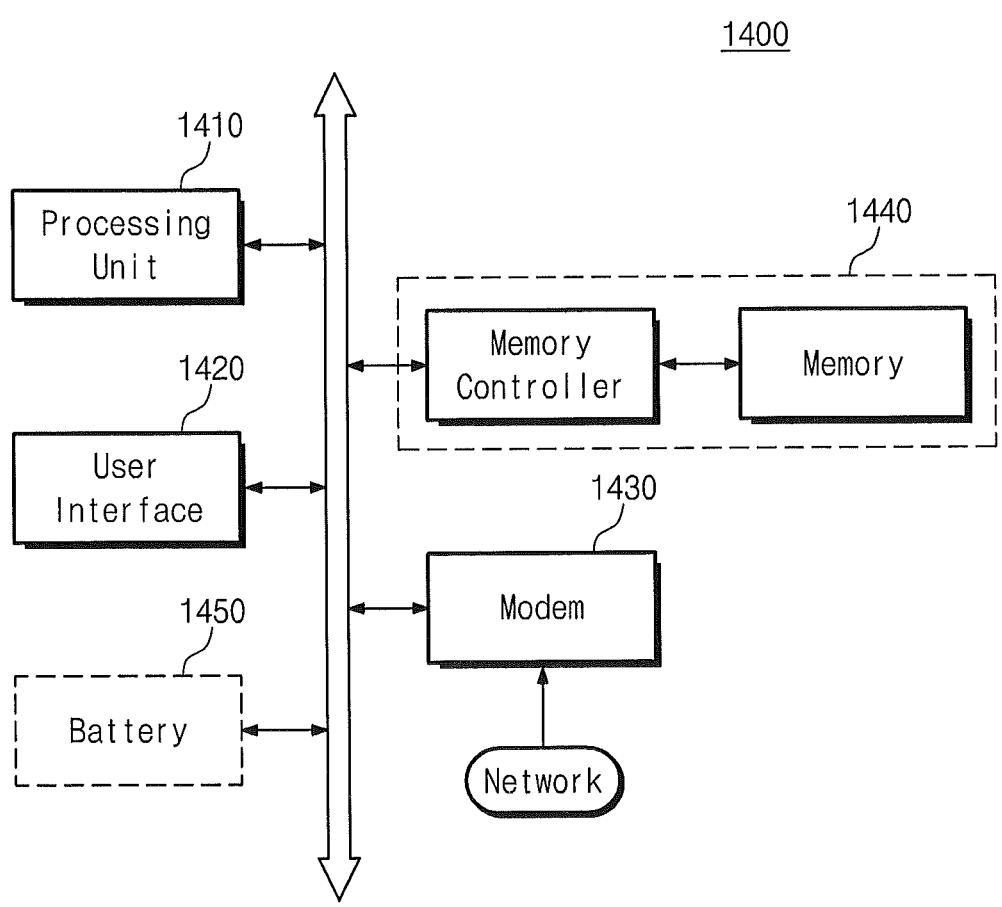
FIG. 19 is a schematic block diagram illustrating an example of an electronic device including a semiconductor package according to some embodiments of the inventive concept.

FIG. 19 is a schematic block diagram illustrating an example of an electronic device including a semiconductor package according to embodiments of the inventive concept.

Referring to FIG. 19, an electronic device 1400 according to some embodiments of the inventive concept may include a processing unit 1410, a user interface unit 1420, a modem 1430 such as a baseband chipset, and the semiconductor package 1440 according to embodiments of the inventive concept. The semiconductor package 1440 may include the memory chip including the measuring device and the controller chip controlling the memory chip.

If the electronic device 1400 is a mobile device, a battery 1450 for supplying an operating voltage of the electronic device 1400 may be additionally provided. The electronic device 1400 may further include at least one of an application chipset and a camera image processor (CIS).

According to embodiments of the inventive concept, the measuring device and the semiconductor chip (e.g., the memory chip or the logic chip) may be integrated in one semiconductor chip. Thus, the physical variation (e.g., temperature variation, strain) of the semiconductor chip may be measured in real time without an additional measuring unit. For example, the physical variation of the semiconductor package mounted in a portable data storage device may be measured in real time.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor package comprising:
a package substrate having first connecting pads and second connecting pads; and
a semiconductor chip mounted on the package substrate, the semiconductor chip including a semiconductor device, a measuring device, input/output (I/O) pads, and measuring pads,
wherein the semiconductor device comprises a semiconductor substrate and is electrically connected to the I/O pads,
wherein the measuring device comprises a redistribution pattern and is on the semiconductor device and is electrically connected to the measuring pads,
wherein the I/O pads are electrically connected to the first connecting pads, and
wherein the measuring pads are electrically connected to the second connecting pads.

2. The semiconductor package of claim 1, wherein the semiconductor device further comprises: integrated circuit elements on the semiconductor substrate; and an insulating layer covering integrated circuit elements, and
wherein the redistribution pattern is on the insulating layer of the semiconductor device.

3. The semiconductor package of claim 2, wherein the measuring device comprises: a thermocouple having metal patterns of metal materials that are different from each other and are on the insulating layer of the semiconductor device.

4. The semiconductor package of claim 2, wherein the measuring device comprises: a strain gauge having a metal grid on the insulating layer of the semiconductor device.

5. The semiconductor package of claim 1, wherein the measuring device is electrically insulated from the semiconductor device.

6. A semiconductor package comprising:
a package substrate having first connecting pads and second connecting pads; and
a semiconductor chip mounted on the package substrate, the semiconductor chip including a semiconductor device, a measuring device, input/output (I/O) pads, and measuring pads,
wherein the semiconductor device comprises a semiconductor substrate and is electrically connected to the I/O pads,
wherein the measuring device is on the semiconductor device and is electrically connected to the measuring pads,
wherein the I/O pads are electrically connected to the first connecting pads, and
wherein the measuring pads are electrically connected to the second connecting pads
wherein the semiconductor chip further comprises: through-electrodes penetrating the semiconductor substrate and connected to the measuring pads.

7. The semiconductor package of claim 1, further comprising:
bonding wires electrically connecting the measuring pads to the second connecting pads.

8. The semiconductor package of claim 1, further comprising:
a controller chip mounted on the package substrate,
wherein the controller chip receives a signal measured from the measuring device of the semiconductor chip to control operation of the semiconductor chip.

9. A data storage device comprising:
a semiconductor chip comprising a semiconductor device and a measuring device on the semiconductor device, the semiconductor device including a semiconductor substrate, and the measuring device configured to measure physical variation of the semiconductor chip and to output a measured signal based on the physical variation; and
a controller receiving the measured signal from the semiconductor chip and controlling operation of the semiconductor chip responsive to the measured signal
wherein the semiconductor device further comprises: integrated circuit elements on the semiconductor substrate; and an insulating layer covering the integrated circuit elements, and
wherein the measuring device comprises: a redistribution pattern on the insulating layer of the semiconductor device.

10. The data storage device of claim 9, wherein the measuring device is electrically insulated from the semiconductor device.

11. The data storage device of claim 9, wherein the measuring device is configured to measure a temperature of the semiconductor chip to output the measured temperature as the measured signal,
wherein the controller is configured to compare the measured temperature with a reference temperature, and
wherein the controller is configured to reduce an operating speed of the semiconductor chip when the measured temperature is higher than the reference temperature.

12. The data storage device of claim 9, wherein the measuring device comprises: a thermocouple having metal patterns of metal materials that are different from each other.

13. The data storage device of claim 9, wherein the measuring device comprises: a strain gauge having a metal grid.

14. A semiconductor package comprising:
a memory chip, the memory chip including a semiconductor substrate, integrated circuit elements including data storage elements on the semiconductor substrate, an insulating layer covering the integrated circuit elements, and a measuring device on the insulating layer, the measuring device configured to measure physical variation of the memory chip and to output a measured signal based on the physical variation; and
a controller receiving the measured signal from the memory chip to control operation of the memory chip responsive to the measured signal.

15. The semiconductor package of claim 14, further comprising:
a first package substrate on which the controller is mounted; and
a second package substrate on which the memory chip is mounted,
wherein the second package substrate is stacked on the first package substrate.

16. The semiconductor package of claim 15, wherein the second package substrate includes first connecting pads and second connecting pads, and
wherein the integrated circuit elements are electrically connected to the first connecting pads and the measuring device is electrically connected to the second connecting pads.

17. The semiconductor package of claim 14, wherein the measuring device comprises: a thermocouple having metal patterns of metal materials that are different from each other and are on the insulating layer.

18. The semiconductor package of claim 14, wherein the measuring device comprises: a strain gauge having a metal grid on the insulating layer.

19. The semiconductor package of claim 14, further comprising:
a package substrate on which the controller and the memory chip are mounted, and
wherein the controller and the memory chip are spaced apart from each other.

* * * * *